(12) United States Patent
Tsigiroglou (10) Patent No.: US 7,343,264 B2
(45) Date of Patent: Mar. 11, 2008

(54) TELEMETRY SIGNAL COLLECTION, PROCESS AND PROVISION EQUIPMENT

(76) Inventor: Kiriakos Tsigiroglou, 78 Vouliagmenis Ave, Athens (GR) 16673

(*) Notice: Subject to any disclaimer, the term of this patent is extended or adjusted under 35 U.S.C. 154(b) by 13 days.

(21) Appl. No.: 10/520,710

(22) PCT Filed: Jul. 10, 2003

(86) PCT No.: PCT/GR03/00029

§ 371 (c)(1),
(2), (4) Date: Jan. 10, 2005

(87) PCT Pub. No.: WO2004/008410

PCT Pub. Date: Jan. 22, 2004

(65) Prior Publication Data

US 2006/0052881 A1   Mar. 9, 2006

(30) Foreign Application Priority Data

Jul. 10, 2002   (GR) ............................. 20020100328

(51) Int. Cl.
*G06F 15/00* (2006.01)

(52) U.S. Cl. .............. 702/188; 292/251.5; 340/539.12; 439/76.1; 700/245; 709/200

(58) Field of Classification Search .................. 702/22, 702/122, 138, 188; 340/531, 527, 953, 539; 342/357.15; 709/200, 224, 250; 700/245; 439/76.1; 232/251.5
See application file for complete search history.

(56) References Cited

U.S. PATENT DOCUMENTS

| 4,763,937 | A  | * | 8/1988 | Sittnick et al. ........... 292/251.5 |
| 4,925,393 | A  | * | 5/1990 | Ingalsbe .................... 439/76.1 |
| 6,459,955 | B1 | * | 10/2002 | Bartsch et al. .............. 700/245 |
| 7,034,677 | B2 | * | 4/2006 | Steinthal et al. ....... 340/539.12 |
| 2005/0278409 | A1 | * | 12/2005 | Kutzik et al. ............... 709/200 |

OTHER PUBLICATIONS

U.S. Appl. No. 60/397,135, filed Jul. 19, 2002.*

* cited by examiner

*Primary Examiner*—John Barlow
*Assistant Examiner*—John Le

(57) ABSTRACT

This patent refers to an electronic equipment unit, which is intended to collects, process and transfer data from a certain area, which it monitors, to a telemetry system. In more detail, data are collected from various intrusion monitoring sensors (e.g. infra-red or microwave detectors), water level detectors, smoke detectors, electrical supply watchdogs etc. These sensor are external and use the logic circuits of the printed circuit board. The above mentioned data are suitably processed by the unit and the output is sent to a telemetry system via an external interface box. The advantages of this patent is the small size of the device and the low cost of the construction and operation of the device. It integrates on one printed circuit board (PCB) the processor and the logic circuits of a variety of sensors. Owing to its small size, the device can be easily installed inside sealed cellular telephony antenna shelters (outdoor shelters).

1 Claim, 10 Drawing Sheets

P.C.B. Top Side

Figure 4

P.C.B. Bottom Side

Figure 5

P.C.B. Silk Screen Side

Figure 6

P.C.B. Solder Mask

Figure 7

TOP VIEW

Figure 8

Part Reference

Figure 9

Dimensions

Figure 10

Dimensions

TELEMETRY SIGNAL COLLECTION, PROCESS AND PROVISION EQUIPMENT

REFERENCES TO RELATED APPLICATIONS

Not Applicable

STATEMENT REGARDING FEDERALLY SPONSORED RESEARCH OR DEVELOPMENT

Not Applicable

BRIEF SUMMARY OF THE INVENTION

This patent refers to an electronic equipment unit, which collects, process and transfers data from a certain area, which it monitors, to a telemetry system. Data are collected from various intrusion monitoring sensors (e.g. infra-red or microwave detectors), water level detectors, smoke detectors, electrical supply watchdogs etc. These data are suitably processed by the unit and the output is sent to a telemetry system via an external interface box. This unit is aimed primarily to be used inside cellular telephony antenna shelters and more particular in sealed type outdoor shelters which have a total space in the order of 3 $m^3$ in contrast of the normal shelters which have the dimensions of a small room (about 35 $m^3$). This electronic equipment unit consists of a metal case with detachable cover, an electronic printed circuit board, a lead battery, a 230/18 VAC transformer, interconnection wiring, special type supply and data cables.

BACKGROUND OF THE INVENTION

Today, similar equipment which collect, process and transfer data from a certain area which they monitor, to a remote information collection system sited at a great distance, are not specifically designed and manufactured for the above mentioned intended application inside cellular telephony antenna shelters. Existing units are either general industrial control central units or security system central units modified to serve the data collection, process and transfer needs.

This results to non conformity with the international safety rules (CE), as well as that the above equipment are not certified for the intended use, with repercussions in case of accidents and interruption of the uninterrupted operation of the cellular telephony shelters.

Moreover, existing units have to use external autonomous sensors, in which the process logic is situated inside the data processing electronic circuit and simply signal the central unit. This leads to a mixture of different, distributed processes, almost impossible to modify or adapt to specific requirements and a variety of hardware, which is difficult to service or maintain.

In addition, as these existing units are not designed to fit inside the sealed type outdoor shelters, cannot be used as such, leaving the shelters without monitoring infrastructure (capabilities). This in turn results to increased operation and maintenance costs of the sealed type outdoor shelters, as they lack monitoring infrastructure, and also that the operators are not able to prevent failures or identify arising problems, so that the appropriate and properly equipped suitable personnel is engaged to deal with it.

DETAILED DESCRIPTION OF THE INVENTION

Figure 1:
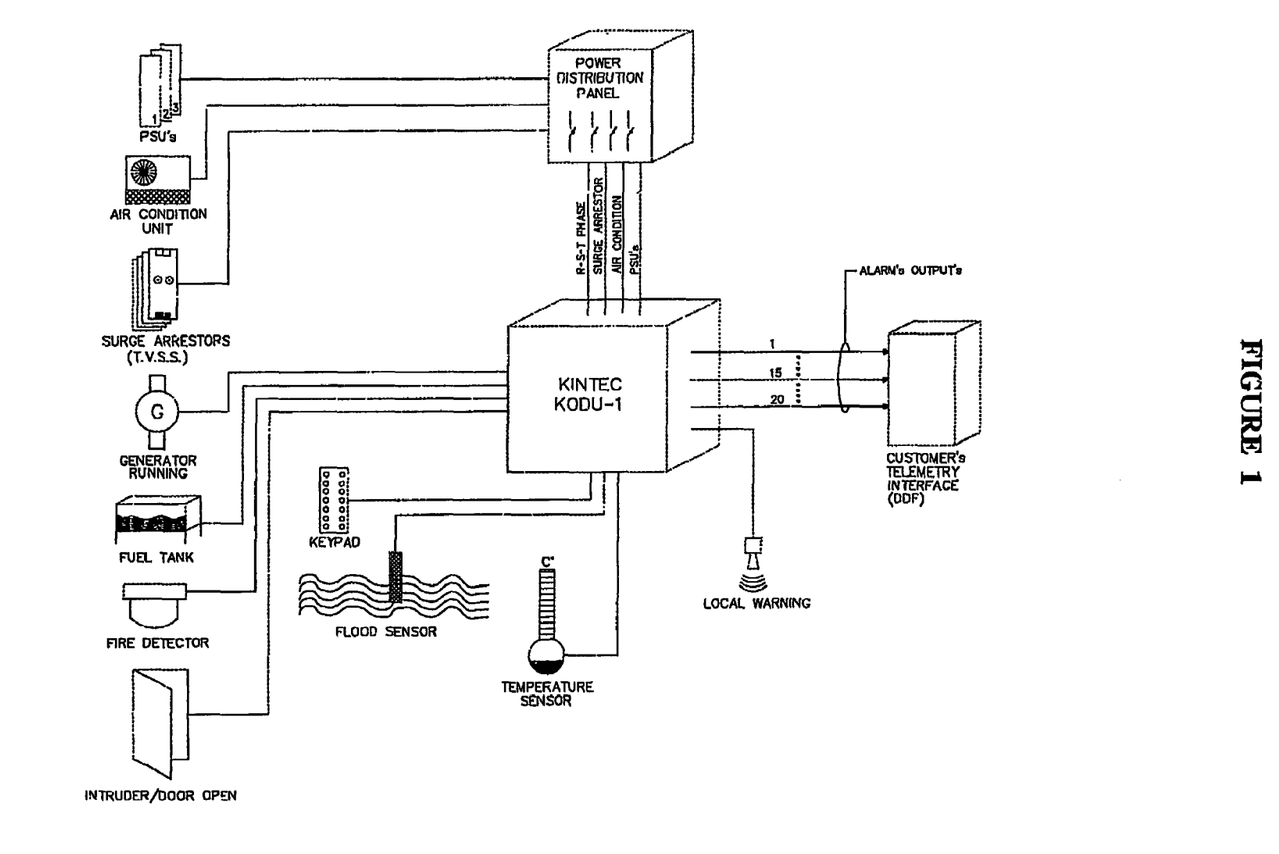
FIG. 1: General overview of a typical installation
Figure 2:
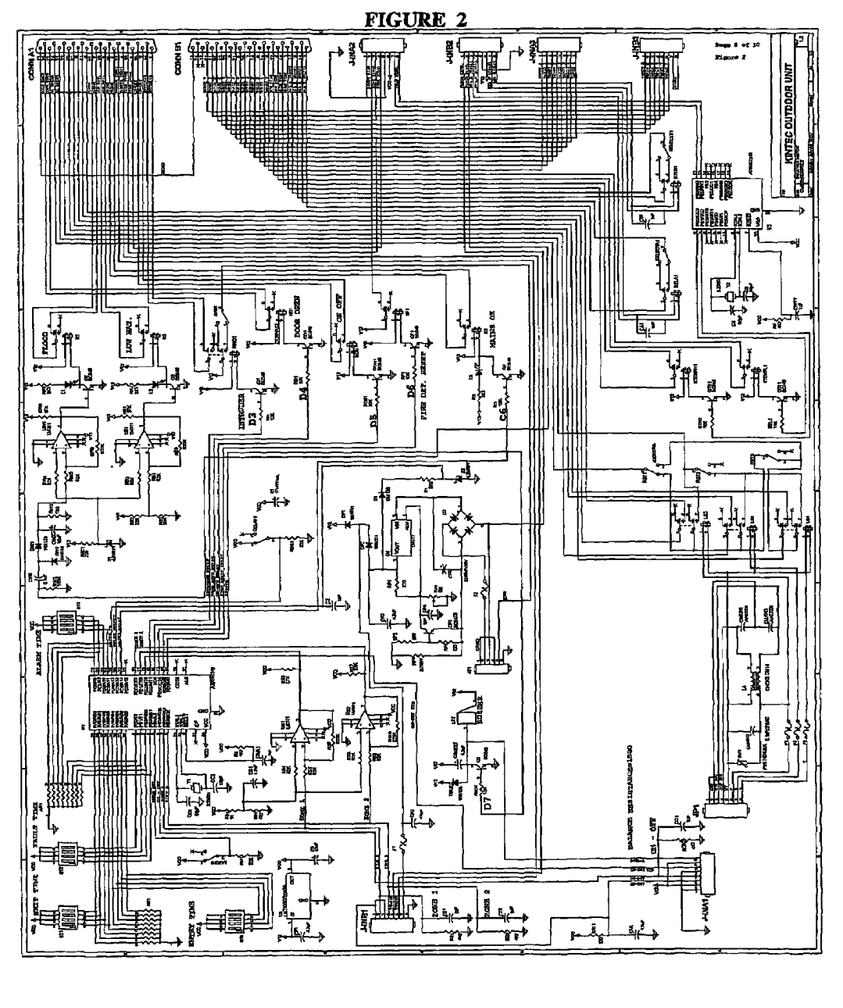
FIG. 2: Electronic circuit diagram

This invention provides the following novel characteristics:

1) It integrates on one printed circuit board (PCB) the processor and the logic circuits of a variety of sensors. As a result, the overall size of the monitoring system is minimized, saving valuable space to the applications where it is installed (e.g. in cellular telephony antenna shelters) and has the unique capability to be installed inside sealed cellular telephony antenna shelters (outdoor shelters).
2) The logic circuits are integrated on the main PCB (FIG. 1 KINTEC-KODU1) whereas all the sensors are external and do not require to have own logic, because they use the logic of the PCB. (FIGS. 1 and 2)
3) Another advantage is that it is not required to purchase extra logic/control electronic circuit boards to interface with the various sensors, as these are included in the main PCB thus significantly cutting down the cost of the monitoring system.
4) The unit is custom designed and built to be used in cellular telephony stations (e.g. GSM) having extreme space limitations. This also results in full compliance with the E.U. safety specifications, as the unit is ready to be installed "as is" (e.g. in cell-phone shelters), without any tampering or modifications, like holes in the case, addition of extra electronic boards, change of power supply source etc
5) The volume and dimensions of the unit together with the choice of two alternative support methods allow it to fit in all known types of sealed type (outdoor) cell-phone shelters.
6) Build-in 3-phase (RST) mains watchdog with capability of logic "OR" or "AND" signaling.
7) Separate "DOOR OPEN" output which indicates the state of the shelter's doors, adds in security and ease of operation. The combination of "DOOR OPEN" and "INTRUDER" alarms provide the operator with enough information to distinguish between an accidental case and an intentional (intruder) attempt
8) Build-in temperature monitor circuit with two set levels for both "Hi" and "Low" temperature alarms 9) Build-in moisture/water level monitor circuit for flood alarm signaling
10) Two independent "free" relays on the printed circuit board for use when special or extra signaling is required.
11) Capability of easy software changes in order to meet future requirements.

The functions of the electronic unit are the following:

1) Check of R-S-T Phase Presence:

If any of the three main's phases is interrupted, a corresponding relay is released (de-energized) and the opening of its contacts signals the relevant alarm to the telemetry system (total 3). If the "serial-parallel" selector is in the "serial" position an additional "A/C BREAK" alarm is generated when any phase is interrupted (logic "OR" operation). If the selector is in the "parallel" position, the "A/C BREAK" alarm is generated only if all 3 phases are missing (logic "AND" operation).

Figure 3:
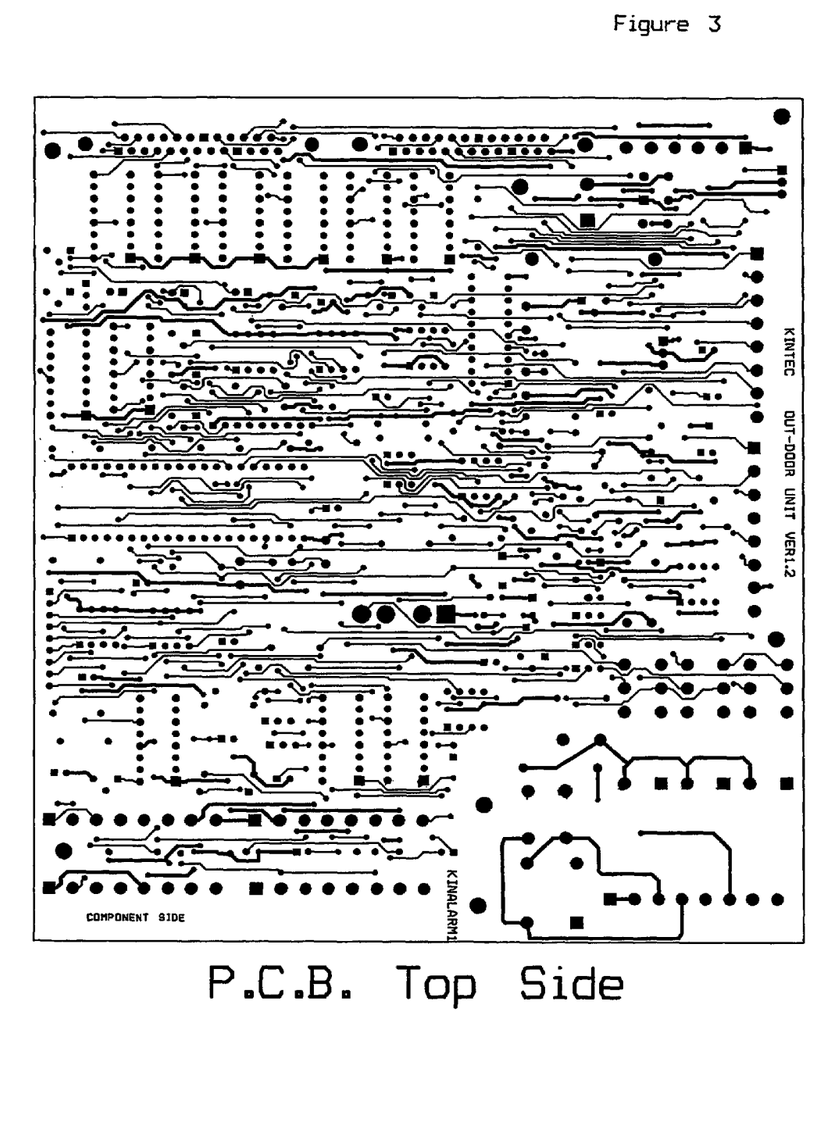
FIG. 3: Printed Circuit Board (PCB) copper track layout, top (component) side.
(The PCB consists of two copper track sides interconected with plated trough holes).

Irrespective of the above, mains supplying the unit is also monitored and the "MAINS OK" relay is held energized with LED L3 lit. When mains supply to the unit is interrupted for more than 20 seconds, L3 is extinguished and the relay is released signaling a relevant alarm (see FIG. 3 logic subroutine "RST").

2) Battery Check:

As long as the voltage at the battery terminals is greater than 10.8 VDC the "LOW BATTERY" relay is held energized and LED L2 is lit. When voltage drops below 10.8 VDC, L2 is extinguished and the relay is released signaling a "LOW BATTERY" alarm (see FIG. 2 logic subroutine "LOW BATTERY").

Note: This function only works when system runs on batteries (no mains present) as at all other times the battery is under charge.

Figure 4:
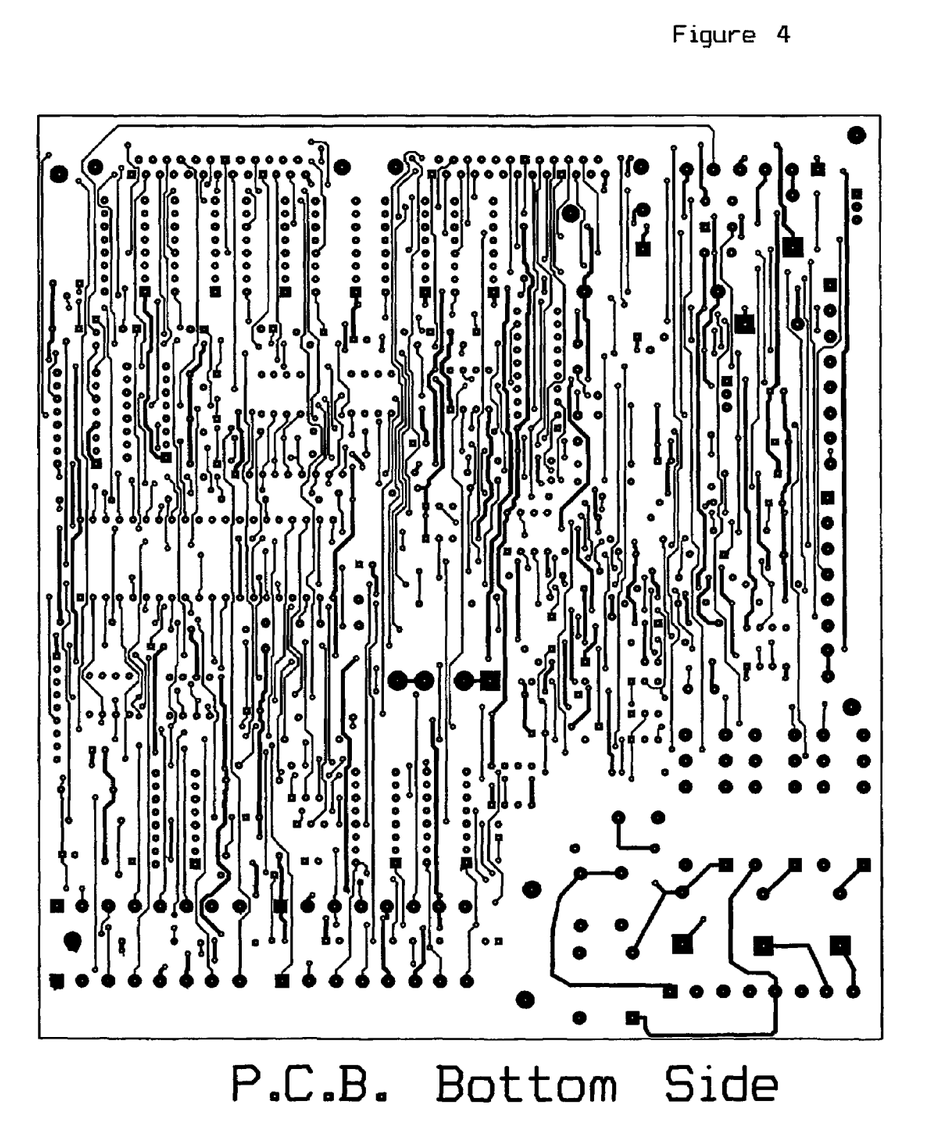
FIG. 4: Printed Circuit Board (PCB) copper track layout, bottom (solder) side.
Figure 5:
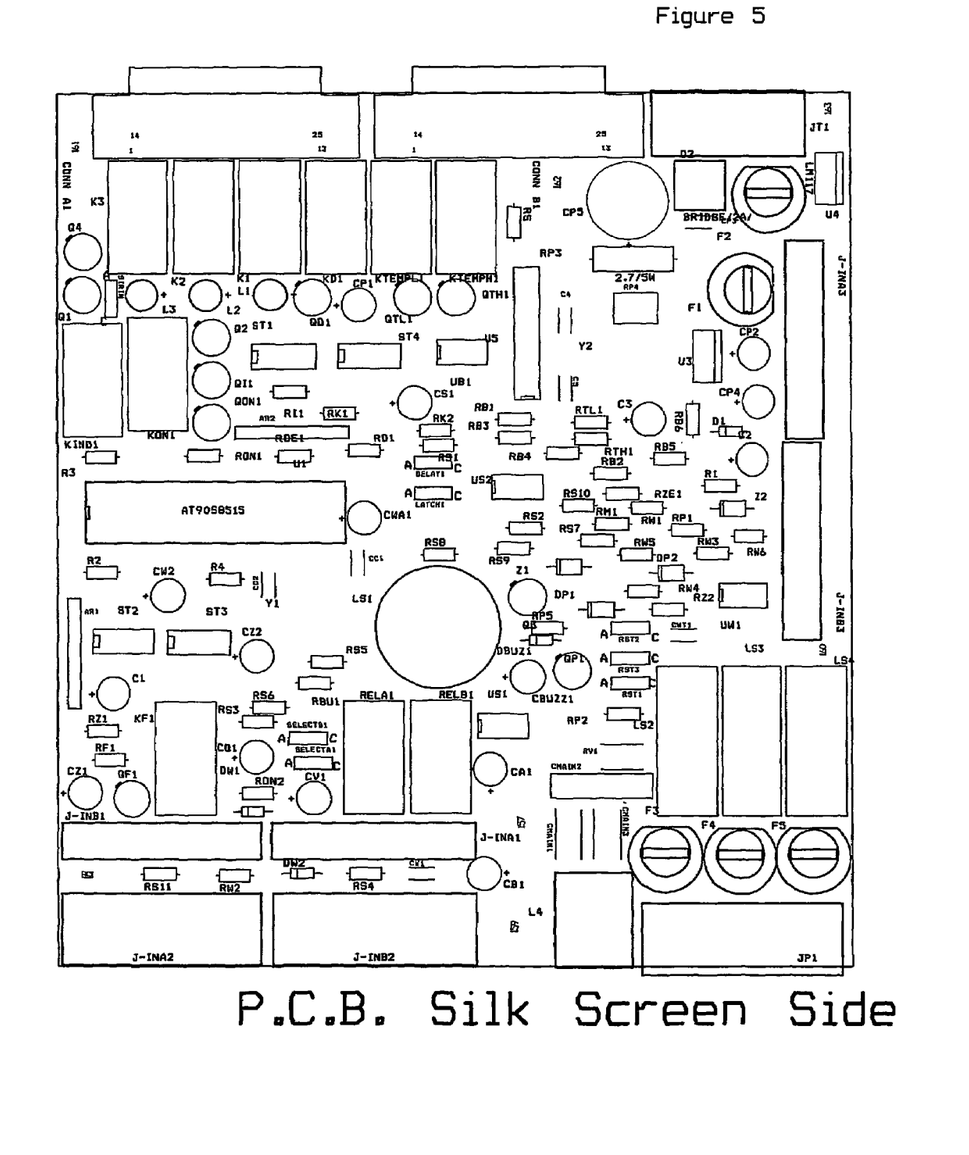
FIG. 5: PCB top-side showing the printed template of component placement.

3) Moisture "FLOOD" Monitoring":

1.5 seconds after the corresponding sensor becomes wet, the "FLOOD" relay energizes signaling a "FLOOD" alarm until the sensor is dry again for more than 5 seconds (see FIG. 4 logic subroutine "FLOOD").

Note: This function only works when system is powered from the mains

Figure 7:
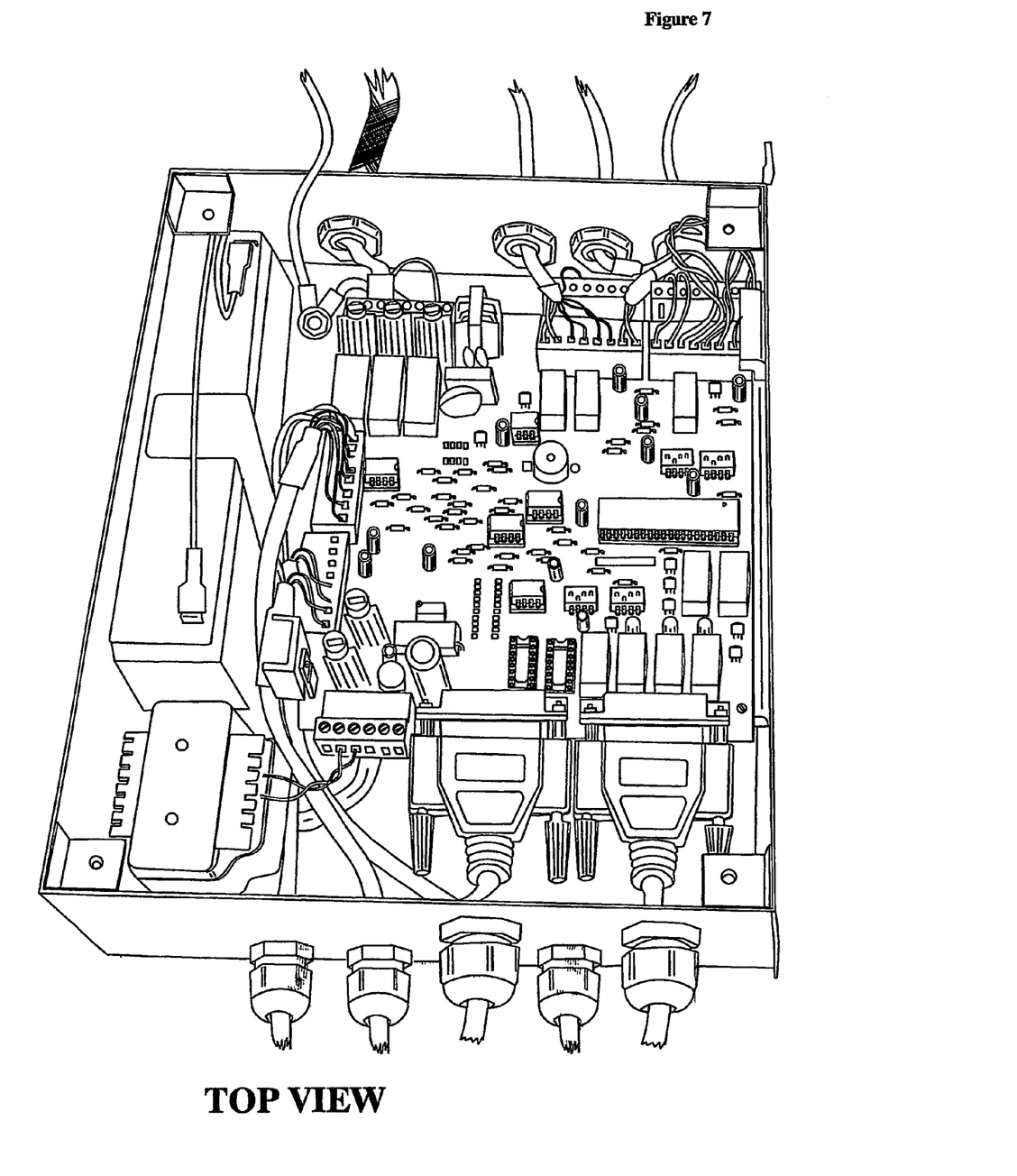
FIG. 7: Schematic of assembled equipment, top view, cover removed.

4) System "ON/OFF":

When the unit receives an "ON" command from the external keypad, then:

4a) Resets the fire detectors by energizing the "FIRE DETECTOR RESET" relay for 2 seconds (see FIG. 7 logic subroutine "FIRE RESET").

4b) Loads the pre-set (selector ST1) "EXIT TIME" delay. This delay has a step of 7.5 sec and maximum value 120 sec. During this time, the buzzer on the unit is sounded continuously.

4c) After "EXIT TIME" expires, the unit checks the resistance of zones 1 and 2 (Balance). If the resistance is within limits (around 1800 ohms) the unit de-energizes the buzzer, energizes the "ON/OFF" relay arming the system and signaling the "ON" state. If the zone(s) are not balanced then the unit loads the preset "FAULT" delay (selector ST2) and sounds the buzzer with a pulsing rate. This delay has a step of 7.5 sec and maximum value 120 sec.

Figure 6:
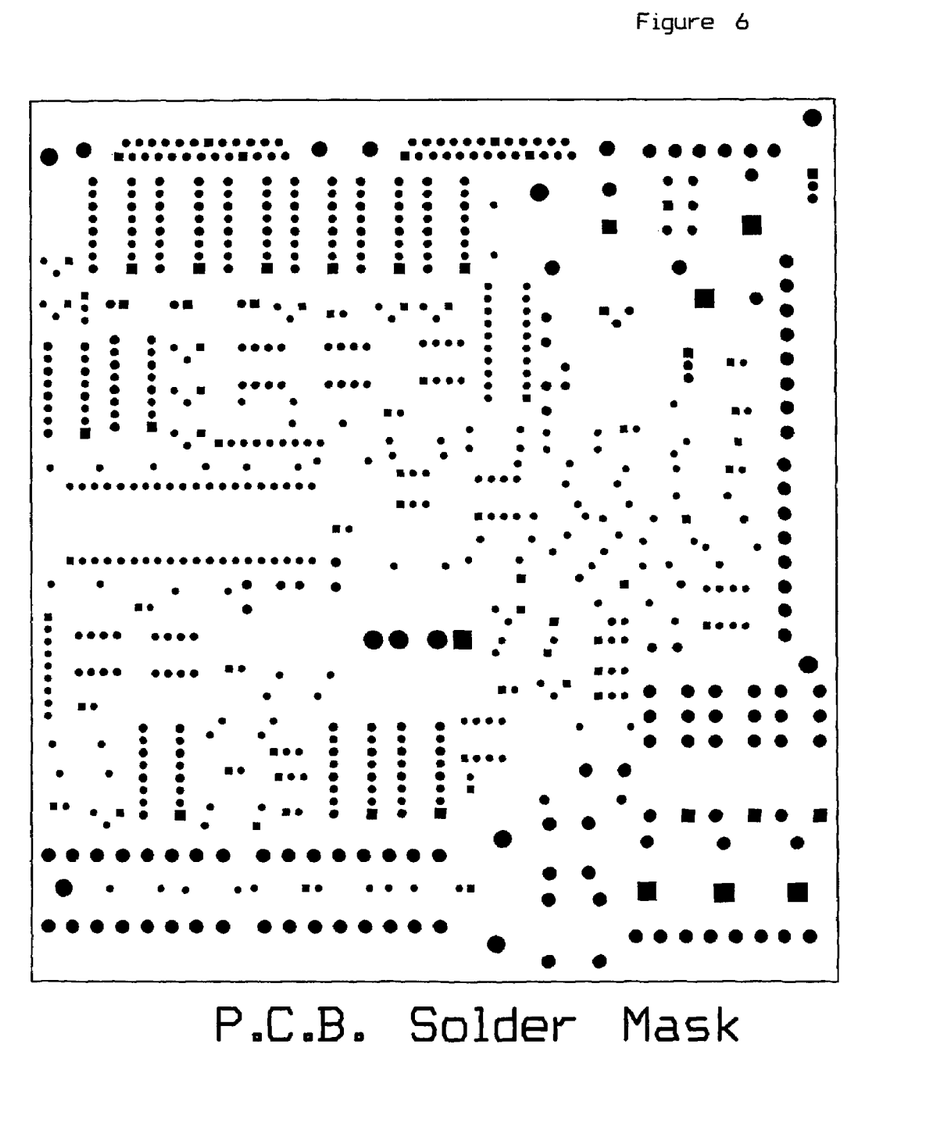
FIG. 6: Printed Circuit Board (PCB) bottom side showing places that solder is applied.

4d) If the zone(s) are still out of balance at the end of the "FAULT" cycle, then the unit stops the buzzer leaving the ON/OFF relay and the system in un-energized (OFF) state. (see FIG. 6 logic subroutine "ON/OFF").

5) Check of the area surveillance zones 1 and 2:

During the time the system is "ON" the unit monitors zones 1 and 2. Zone 1: If zone 1 becomes unsettled, the unit loads the preset "ENTRY TIME" delay (selector ST4 with a time step of 7.5 sec and maximum 120 sec) and sounds the buzzer. If at the end of this delay the zone is still unsettled, the unit energizes the "INTRUDER" relay sending the corresponding alarm to the telemetry system.

Figure 8:
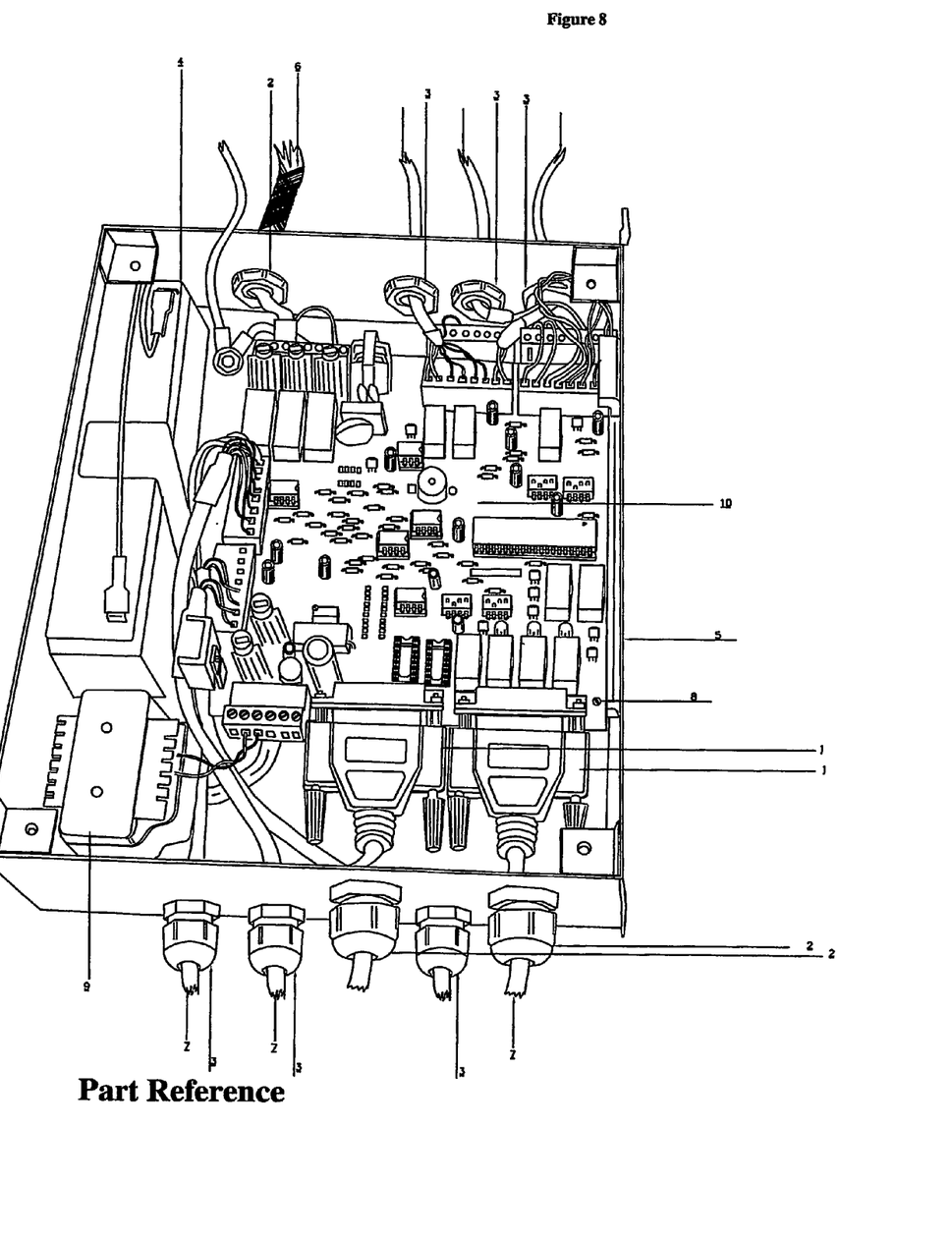
FIG. 8: Schematic of assembled equipment, top view, cover removed, showing placement of major components.
Figure 9:
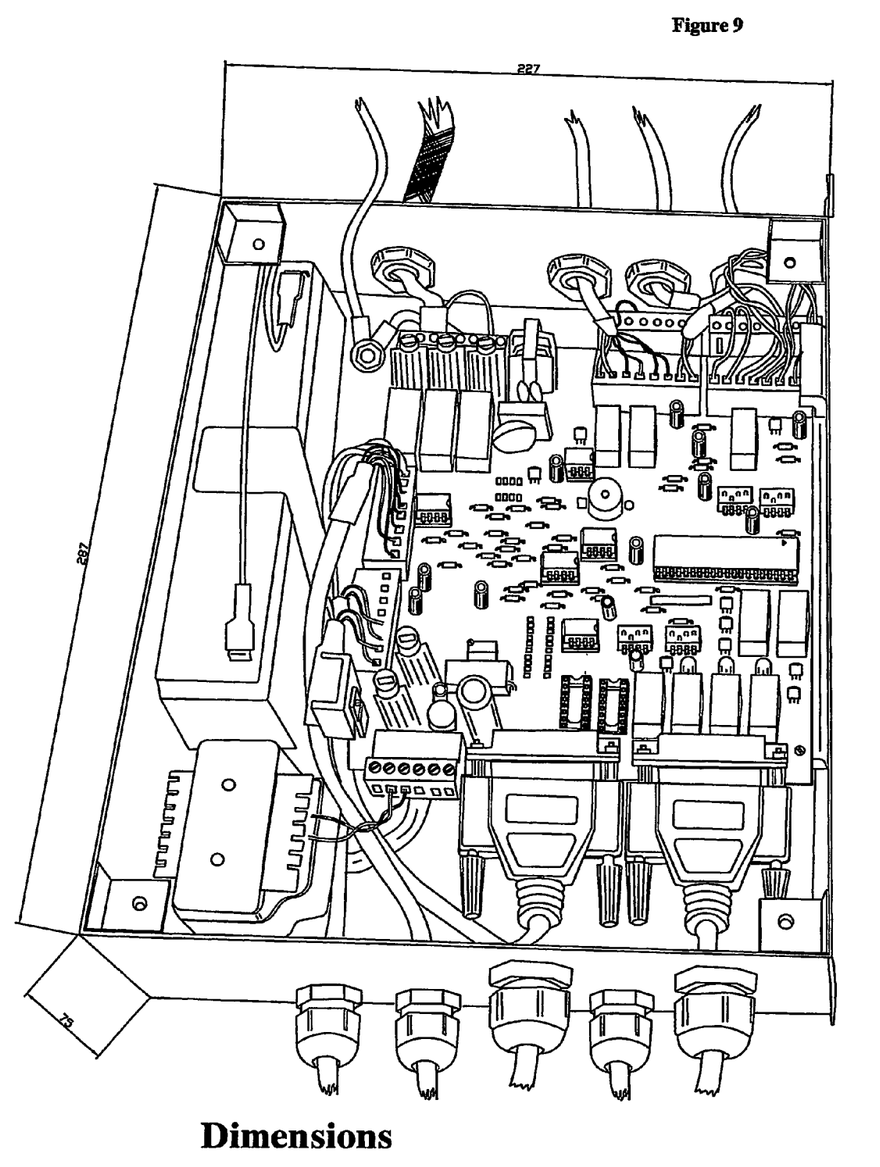
FIG. 9: Schematic of assembled equipment, top view, cover removed, showing overall case dimensions.
Figure 10:
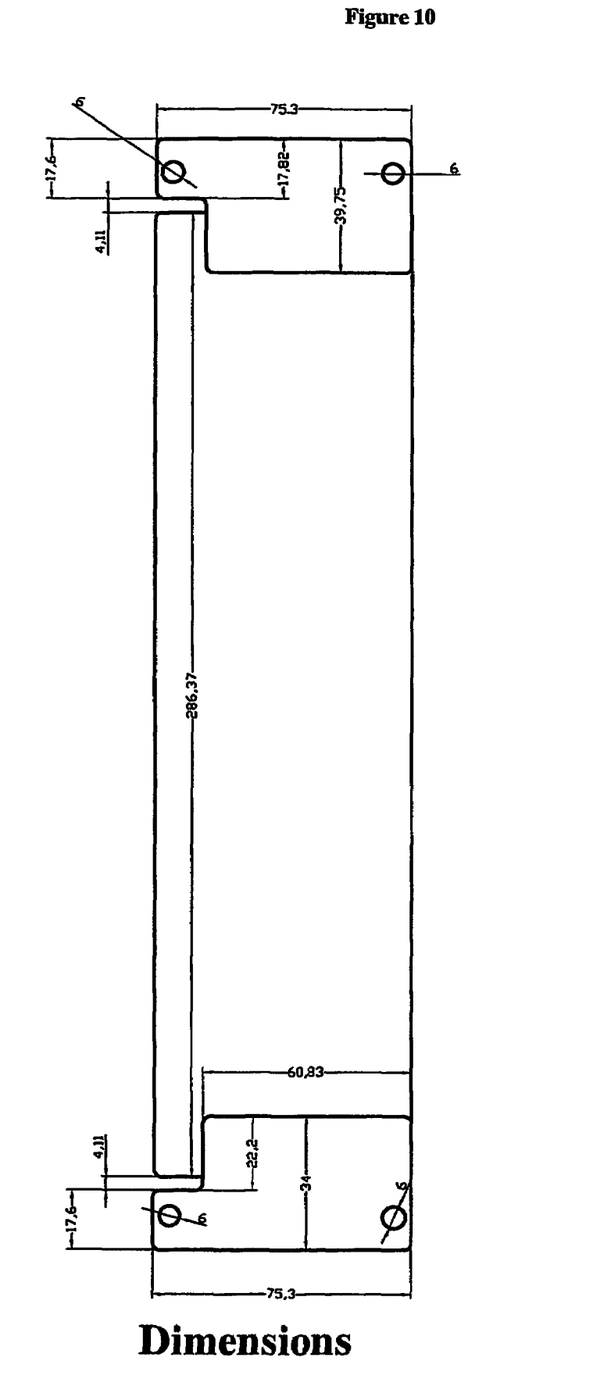
FIG. 10: Dimensions of optional wall mount bracket.

Zone 2: If zone 2 becomes unsettled, the unit checks the state of "DELAY 1" preset. If it is set to "DELAY" position then sequence followed is the same as for zone 1. In other case the "INTRUDER" relay is energized immediately without any sound warning. (see FIGS. 8, 9 & 10 logic subroutines "ZONE1", ZONE2" & "INTRUDER").

6) "LATCH" function:

If the "LATCH" function has been selected, the "INTRUDER" relay remains energized until the unit is set to "OFF" state from the external keypad.

If the "LATCH" function has not been selected, the "INTRUDER" relay remains energized for a predetermined "ALARM TIME" set by selector ST3.

This time has a step of 37 seconds and can take a maximum value of 600 seconds. (see FIG. 10 logic subroutine "INTRUDER").

7) "DOOR OPEN" Function:

This independent function closely monitors the state of both zones 1 and 2 and if any becomes unsettled "DOOR OPEN" relay signals a relevant alarm to the telemetry without any delay and for as long as the problem persists.

8) Battery Charging:

The unit incorporates a suitable circuit for the automatic charging of it's battery which is 12 V 2.2 AH. (see circuit description section Para. 4)

9) "Feed Troughs":

On the printed circuit board of the unit there are two spare relays RELA1 and RELB1. Their coils and contacts are available at the connection posts and can be selected to be "normally open" (N/O) or "normally closed" (N/C) via selectors SELECT1 and SELECTB1.

Also on the printed circuit board there are a number of direct connections between connectors aimed to ease wiring and routing of certain telemetry signals not requiring processing. These are described in the "KINTEC OUTDOOR UNIT INTERCONNECTION" diagram and shown in the printed circuit board schematic.

Description of the electronic diagram of the unit

The electronic circuit consists of the following parts/sub-circuits:

1) The microprocessor core parts are the integrated circuit (U1) AT90S8515 microprocessor, crystal (Y1), capacitors CC1, CC2, CWA1, C1 and the watchdog integrated circuit (U2).

Circuits that are controlled by the microprocessor are:

1a) Time delay circuits EXIT, FAULT, ALARM and ENTRY TIME consisting of parts: ST1, ST2, ST3, ST4, AR1 and AR2.

1b) Selection of delayed operation of zone 2 (DELAY1, RDE) and intruder relay latch (LATCH, RM1).

1c) Zone1 and zone2 ON-OFF monitoring circuits consisting of parts: J-INB1, J-INA1, CZ1, CV1, CO1, CZ2, RZ1, RZ2, RS11, RON2.

1d) Zone balance control circuits consisting of parts: RS1, RS2, RS4, RS5, RS8, RS9, RS3, RS7, US1 and US2.

1e) Mains monitoring circuit. Parts D1, Z2, R1 and C2.

1f) Microprocessor data output circuits controlling INTRUDER, DOOR OPEN, ON-OFF, FIRE RESET, MAINS OK and BUZZER relays, consisting of the relevant parts: RI1, QI1, KIND1-RD1, QD1, KD1-RON1, QON1, KON1-RF1, QF1, KF1-R2, R3, L3, Q4, K5-RBU1, Q3, CBUZZ1, DBUZ1, LS1.

The dry-contact outputs of the relays above are available at the connectors CONNA1, CONNB1, J-INA2 and J-INB2 and are consequentially routed via the interface box to the telemetry panel.

2) Analog circuits independent from the microprocessor, monitor the battery voltage (LOW BATTERY), moisture (FLOOD) and the 3 phases (RST) and consist of parts: RB2, RB3, RB4, RB5, RB6, RB1, RK2, Q2, L2, K2 (LOW BAT), RW1, RW2, RW3, RW4, RW5, RK1, RZE1, CW1, CW2, Z1, Q1, K1, L1, UW1 (FLOOD) and LS2, LS3, LS4, RST1, RST2, RST3 (RST).

3) Feed through circuits consisting of: RELA1, RELB1, SELECTA1 and SELECTB1 and interconnections between connectors CONNB1, J-INA3 and J-INB3

4) Power supply and battery charging circuits consisting of: F1, F2, F3, F4, F5, RV1, CMAIN2, L4, CMAIN1, RP1, RP2, RP3, RP4, RP5, CP5, CP4, CP2, CP3, D2, DP1 and DP2

The way that all circuits operate and co-operate between them is analytically presented in the included logic diagrams and in the detailed operational description of the unit The Case The unit is housed in a metal case accommodating a) the printed circuit board (PCB), b) the supply transformer and c) the battery.

The case supports and protects the above from external environmental elements, provides safety to personnel, and acts as an electromagnetic shield to and from the environment (EMI/EMC).

The dimensions of the case are 290×225×76 mm. It consists of a main body and a removable cover secured with 4 screws on corresponding threads bonded at the main body corners.

The case is manufactured from rolled iron sheet (dcp) of 1.0 mm thickness for the main body and 0.8 mm for the cover and is electrostatic painted to a thickness of 60 microns.

Inside the main body of the case are bonded: threads for the cover, supports for the printed circuit board, a metal duct for the 220 V mains cable, battery support, transformer mounting posts as well electromagnetic and safety grounding posts.

The cover is also equipped with a bonded grounding post for increased electromagnetic shielding and safety.

On the upper and lower sides of the main body (225×76 mm) there are 10 openings with plastic liquid tight cable strain relief for the secure and safe cable exit/entry to and from the peripheral devices.

On the side of the main body of the case (290×76 mm) there are bonded angled metal strips with holes for supporting the unit when installed in racks. Alternatively a separate metal two part split brace is available to enable wall installation if required.

The case is secured with an anti-tamper switch, which signals a corresponding illegal tamper alarm if the case is opened by non authorized personnel.

The above description refers to the attached schematics, which show the preferred realization of this invention. Other realizations or modifications are possible if they do not part from the spirit and scope of this invention. For example, various combinations of sensors can be used to meet different monitoring needs. Furthermore, this invention can be used in an antenna shelter of any system and generally where a space problem exists. As a result, the present analytical description is explanatory and does not confine the invention. The scope and spirit of the invention are defined in the attached claims.

The invention claimed is:

1. Electronic device KINTEC KODU-1 of compact design and construction for supervising a specific area, wherein said electronic device collects raw data from external sensors, which do not have their own onboard decision logic and the sensors produce analogue electric signals, said electronic device processes the collected data and transmits data from a specific area, which it supervises to an information collection system located at a long distance from the supervised area, wherein the electronic device comprises an electronic printed circuit which integrate:
   a) an interface for the connection to external analogue and by-stable sensors;
   b) processing means for:
      i) integrating a decision logic of a combination or all of -infra Red motion, power network R-S-T phases presence, temperature, water presence, status of doors for open or closed, battery voltage, smoke presence, generator status for running or not and air condition-external sensors, and
      ii) collecting, comparing; and combining data from the external sensors,
   wherein the electronic device integrates on the electronic printed circuit, wherein two or more additional independent relay circuits serving the signaling needs, wherein said electronic device is designed for use in the antenna shelters of mobile telephony, and wherein the electronic printed circuit is placed in an enclosure consisting of a case, with four side walls and a detachable cover and is made of a material providing safety to the staff, protection from environmental elements and electromagnetic shielding from and to the environment, wherein the case contains:
   openings at the sidewalls to allow passage and mounting of the circuits connecting cables at the internal part of the case with external peripheral devices,
   metallic supports for mounting the electronic printed circuit on a receptacle base,
   metallic duct in the case base for driving and protection of the power cable,
   grounding posts for electromagnetic and safety grounding,
   a grounding post on the detachable cover, connected with the grounding of the main body for complete electromagnetic shielding and safety,
   a special metallic base for battery mounting and support, points of support of a transformer, and
   metal strips welded on the external surface of the main body of the case base (290×76 mm) with openings for side mounting of the device in racks.

* * * * *